United States Patent
Zhuang et al.

(10) Patent No.: US 9,840,769 B2
(45) Date of Patent: *Dec. 12, 2017

(54) SPUTTERING TARGET, OXIDE SEMICONDUCTING FILM, AND METHOD FOR MAKING THE SAME

(71) Applicants: Tsinghua University, Beijing (CN); HON HAI PRECISION INDUSTRY CO., LTD., New Taipei (TW)

(72) Inventors: Da-Ming Zhuang, Beijing (CN); Ming Zhao, Beijing (CN); Ming-Jie Cao, Beijing (CN); Li Guo, Beijing (CN); Liang-Qi Ouyang, Beijing (CN); Ru-Jun Sun, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 115 days.

This patent is subject to a terminal disclaimer.

(21) Appl. No.: 14/922,764

(22) Filed: Oct. 26, 2015

(65) Prior Publication Data

US 2017/0037506 A1 Feb. 9, 2017

(30) Foreign Application Priority Data

Aug. 6, 2015 (CN) .......................... 2015 1 0477922

(51) Int. Cl.
*H01B 1/08* (2006.01)
*C23C 14/08* (2006.01)
(Continued)

(52) U.S. Cl.
CPC .......... *C23C 14/3414* (2013.01); *C23C 14/08* (2013.01); *H01B 1/08* (2013.01);
(Continued)

(58) Field of Classification Search
CPC .. H01B 1/00; H01B 1/08; H01L 29/02; H01L 29/12; H01L 29/24; C23C 14/34; C23C 14/58; C23C 14/08
See application file for complete search history.

(56) References Cited

U.S. PATENT DOCUMENTS 9,082,861 B2 * 7/2015 Yamazaki ........... H01L 29/7869
9,530,640 B2 * 12/2016 Zhuang ............. H01L 21/02554
(Continued)

FOREIGN PATENT DOCUMENTS

JP 2015113512 A * 6/2015
TW 201035340 10/2010

OTHER PUBLICATIONS

Koo et al "Electrical and optical characteristics of co-sputtered amorphous Ce-doped indium-zinc-oxide thin film tranistors", Journal of the Korean Physical Society, vol. 62, No. 3, Feb. 2013, pp. 527-530.*

*Primary Examiner* — Mark Kopec
(74) *Attorney, Agent, or Firm* — ScienBiziP, P.C.

(57) ABSTRACT

An oxide semiconductor film includes indium (In), cerium (Ce), zinc (Zn) and oxygen (O) elements, and a molar ratio of the In, Ce, and Zn as In:Ce:Zn is in a range of 2:1:(0.5 to 2). A method for making a oxide semiconductor film includes a step of forming an oxide film on a substrate by using a sputtering method and a sputtering target comprising $In_2CeZn_xO_{5+x}$, wherein x=0.5~2.

10 Claims, 7 Drawing Sheets

(51) Int. Cl.
*C23C 14/34* (2006.01)
*H01L 29/24* (2006.01)
*H01L 29/786* (2006.01)
*H01J 37/34* (2006.01)

(52) U.S. Cl.
CPC .......... *H01J 37/3429* (2013.01); *H01L 29/24* (2013.01); *H01L 29/78693* (2013.01)

(56) References Cited

U.S. PATENT DOCUMENTS

| 2006/0234088 | A1 | 10/2006 | Inoue et al. | |
| 2010/0276688 | A1* | 11/2010 | Yano | H01L 29/7869 257/43 |
| 2016/0326633 | A1* | 11/2016 | Zhuang | C23C 14/08 |

* cited by examiner

SPUTTERING TARGET, OXIDE SEMICONDUCTING FILM, AND METHOD FOR MAKING THE SAME

CROSS-REFERENCE TO RELATED APPLICATIONS

This application claims all benefits accruing under 35 U.S.C. §119 from China Patent Application No. 201510477922.6, filed on Aug. 6, 2015, in the China Intellectual Property Office.

FIELD

The present disclosure relates to semiconductor manufacture.

BACKGROUND

Display devices should have high resolution, high response speed, low energy consumption, high transparency, and flexibility. These qualities depend on performances of thin film transistors (TFTs) used in the display devices. An amorphous silicon TFT has a relatively low carrier mobility, which cannot meet the requirements of high resolution and large area display. A low temperature poly-silicon (p-Si) TFT can have a high mobility. However, a high cost is incurred in creating a large area display device with the p-Si TFT. Recently, an amorphous oxide semiconductor, indium gallium zinc oxide (InGaZnO$_4$, or IGZO), has been proposed. An IGZO based TFT has a high transparency, a low manufacturing temperature, and a good compatibility with the TFT manufacturing technology.

The mobility of the IGZO TFT is between that of the amorphous silicon TFT and the p-Si TFT, thus improvement is still required. An indium zinc oxide (IZO) device, with high carrier density and a low stability, is not a semiconductor but has a higher carrier mobility than that of IGZO.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "comprise" or "comprising" when utilized, means "include or including, but not necessarily limited to"; it specifically indicates open-ended inclusion or membership in the so-described combination, group, series, and the like. The term "contact" when utilized, means "direct contact" or "physical contact."

One embodiment of a sputtering target comprises an indium cerium zinc oxide represented by formula In$_2$CeZn$_x$O$_{5+x}$, wherein x=0.5~2. In one embodiment, 0.5≤x<1. In another embodiment, 1<x≤2.

The sputtering target can be obtained by sintering a mixture of indium oxide (In$_2$O$_3$), cerium oxide (CeO$_2$), and zinc oxide (ZnO). In one embodiment, the sputtering target is obtained by sintering only the mixture of In$_2$O$_3$, CeO$_2$, and ZnO. Impurities may exist in the mixture. Besides In$_2$O$_3$, CeO$_2$, and ZnO, the mixture may only comprise the impurities. The smaller the amount of the impurities in the mixture the better. In one embodiment, the amount of the impurities can be less than 10 ppm.

The In$_2$CeZn$_x$O$_{5+x}$ is a crystal (or crystalline solid). The sputtering target can also comprise a non crystalline (amorphous) solid. The amorphous solid comprises indium oxide, cerium oxide, and zinc oxide. In one embodiment, a weight percentage of the crystalline In$_2$CeZn$_x$O$_{5+x}$ in the sputtering target is above 80%.

In one embodiment, the sputtering target only comprises In$_2$CeZn$_x$O$_{5+x}$, In$_2$O$_3$, CeO$_2$, and ZnO. In another embodiment, the sputtering target only comprises In$_2$CeZn$_x$O$_{5+x}$. Besides In$_2$CeZn$_x$O$_{5+x}$ (and In$_2$O$_3$, CeO$_2$, and ZnO if have), the sputtering target may only comprise unwanted and trace amounts of impurities. The smaller the amount of impurities in the sputtering target the better. In one embodiment, the amount of impurities in the sputtering target can be less than 10 ppm.

A relative density of the sputtering target can be larger than or equal to 90%. The relative density is a ratio of a real density of the sputtering target to a theoretical density of In$_2$CeZn$_x$O$_{5+x}$.

A bulk resistance of the sputtering target can be in a range from about $10^{-2}$ Ωcm to about 10 Ωcm.

An average surface roughness of the sputtering target can be less than or equal to 2 microns, and in one embodiment be less than or equal to 0.5 microns.

An average flexural strength of the sputtering target can be larger than or equal to 50 MPa, and in one embodiment be larger than or equal to 55 MPa.

Figure 1:
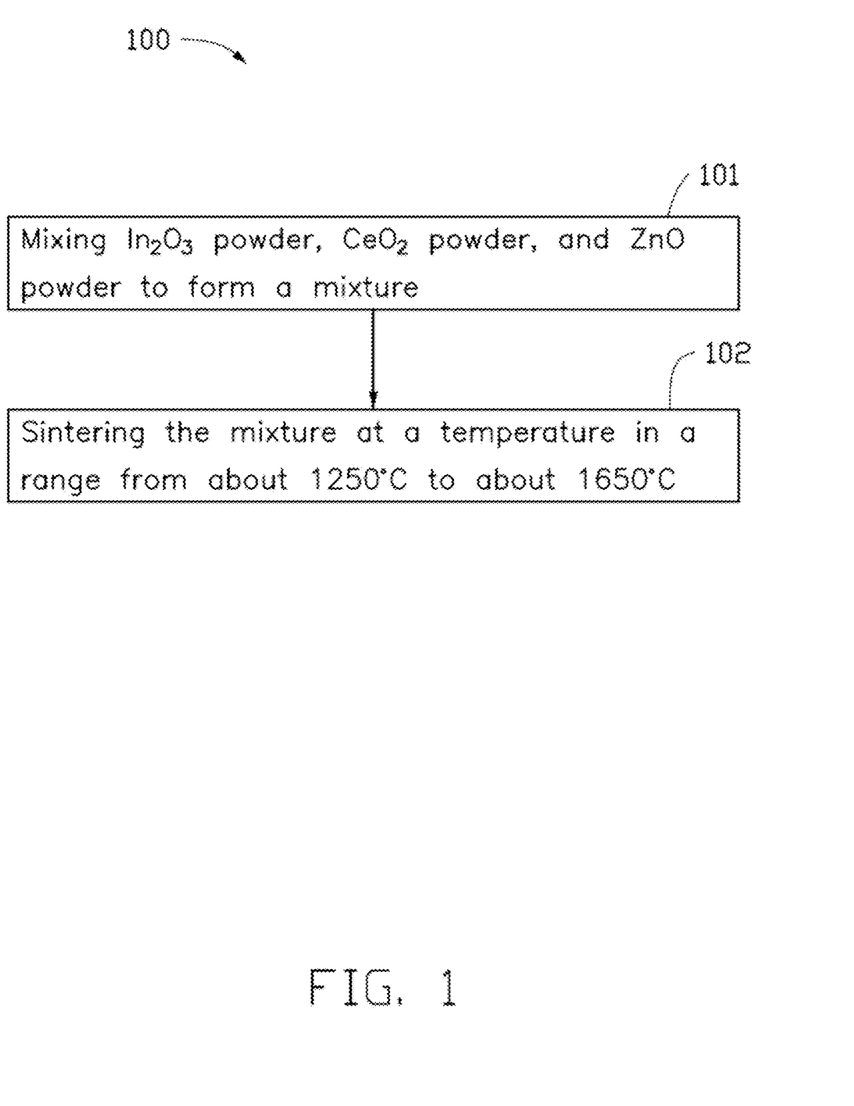
FIG. 1 is a flowchart of a method for making a sputtering target.

FIG. 1 presents a flowchart in accordance with an illustrated example embodiment. The embodiment of a method 100 for making the sputtering target is provided by way of example, as there are a variety of ways to carry out the method 100. Each block shown in FIG. 1 represents one or more processes, methods, or subroutines carried out in the exemplary method 100. Additionally, the illustrated order of blocks is by example only and the order of the blocks can be changed. The exemplary method 100 can begin at block 101.

Depending on the embodiment, additional steps can be added, others removed, and the ordering of the steps can be changed.

At block 101, the $In_2O_3$ powder, $CeO_2$ powder, and ZnO powder are mixed to form a mixture. In the mixture, a molar ratio of indium (In), cerium (Ce), and zinc (Zn) as In:Ce:Zn is substantially 2:1:(0.5 to 2).

At block 102, the mixture is sintered at a temperature in a range from about 1250° C. to about 1650° C.

In the mixture, the particles of $In_2O_3$ powder, $CeO_2$ powder, and ZnO powder can respectively have an average diameter that is less than or equal to 10 microns. In one embodiment, the average diameter of the particles of $In_2O_3$ powder, $CeO_2$ powder, and ZnO powder can respectively be in a range from about 0.5 microns to about 2 microns.

The purity of the $In_2O_3$ powder, $CeO_2$ powder, and ZnO powder can be 3N (99.9 mass %) to 5N (99.999%).

A molar ratio of the $In_2O_3$ powder, $CeO_2$ powder, and ZnO powder as $In_2O_3:CeO_2:ZnO$ is substantially 2:2:(1~4). In one embodiment, In:Ce:Zn is not 2:1:1, and $In_2O_3:CeO_2:ZnO$ is not 1:1:1.

The $In_2O_3$ powder, $CeO_2$ powder, and ZnO powder can be mixed in air or in a protective atmosphere (e.g., in argon (Ar) or nitrogen ($N_2$) gas). The mixing of the $In_2O_3$ powder, $CeO_2$ powder, and ZnO powder can further comprise steps of: ball milling the $In_2O_3$ powder, $CeO_2$ powder, and ZnO powder together in a liquid medium to form a mixed substance; drying the mixed substance to remove the liquid medium to obtain the mixture that is dry. The liquid medium is not reactive with the $In_2O_3$ powder, $CeO_2$ powder, and ZnO powder and can be removed from the wet mixed substance by a drying step, and brings no impurity substance into the mixture. The liquid medium can be water, ethanol, acetone, or combinations thereof. The ball milling can take place in a ball milling machine. The liquid medium, $In_2O_3$ powder, $CeO_2$ powder, and ZnO powder are introduced into the ball milling machine. A rotating speed of the ball milling machine can be about 100 rpm to about 600 rpm. During the ball milling, the $In_2O_3$ powder, $CeO_2$ powder, and ZnO powder mix uniformly, the particle diameters of the powders can decrease, and the specific surface area of the particles of the powders can increase. The ball milling can last until the $In_2O_3$ powder, $CeO_2$ powder, and ZnO powder are uniformly mixed and the particle diameters of the powders have decreased to the desired sizes. The mixed substance is taken out from the ball milling machine and dried, for example at about 30° C. to about 60° C., to remove the liquid medium. The mixed substance can be dried in air or a protective atmosphere (e.g., Ar gas or $N_2$ gas). In one embodiment, the mixed substance is dried at a high purity (3N to 5N) of protective gas.

The mixture can be sintered in a protective atmosphere (e.g., in argon (Ar) or nitrogen ($N_2$) gas).

The mixture can be molded or pressed into a desired shape before or during the sintering step. During the sintering step, the $In_2O_3$ powder, $CeO_2$ powder, and ZnO powder react to form the crystalline solid $In_2CeZn_xO_{5+x}$.

A hot pressing method or a hot isostatic pressing (HIP) method can be used to simultaneously mold/press and sinter the mixture. The hot pressing applies a pressure of about 30 MPa to 100 MPa at the temperature of about 1250° C. to about 1650° C. for about 1 hour to about 24 hours. The hot isostatic pressing applies a pressure of about 100 MPa to 300 MPa at the temperature of about 1250° C. to about 1650° C. for about 1 hour to about 40 hours.

When the sintering step takes place after the molding/pressing step, the molding/pressing step can be processed by using a cold pressing method or a cold isostatic pressing method. The mixture can be filled into a mold and molded/pressed by applying a pressure of about 30 MPa to about 300 MPa to form the desired shape. The mixture with the desired shape can be sintered under normal pressure.

The sputtering target can be obtained directly from the sintering step. In another embodiment, the product of the sintering step can be shaped or polished to form the sputtering target.

One embodiment of an oxide semiconductor film comprises In, Ce, Zn and O elements, having a molar ratio of In, Ce, and Zn as In:Ce:Zn is 2:1:(0.5 to 2). The oxide semiconductor film is an n-type semiconductor having a carrier density of about $10^{12}$ $cm^{-3}$ to about $10^{20}$ $cm^{-3}$, and a carrier mobility of about 5.0 $cm^2V^{-1}s^{-1}$ to about 45.0 $cm^2V^{-1}s^{-1}$.

The oxide semiconductor film can be an amorphous solid. In another embodiment, the oxide semiconductor film can also comprise crystalline solid $In_2CeZn_xO_{5+x}$.

In one embodiment, unwanted and trace impurities are the only substance in the oxide semiconductor film beyond the elements of In, Ce, Zn and O. The smaller the amount of impurities in the sputtering target the better. In one embodiment, the amount of impurities in the oxide semiconductor film can be less than 10 ppm.

The oxide semiconductor film can have a band gap of about 3.0 eV to about 3.5 eV.

The oxide semiconductor film can have a visible light transmittance of about 60% to about 90%.

The oxide semiconductor film can have a thickness of about 50 nm to about 1000 nm.

The oxide semiconductor film can have a carrier density of about $10^{13}$ $cm^{-3}$ to about $10^{15}$ $cm^{-3}$.

The oxide semiconductor film can have a carrier mobility of about 14.2 $cm^2V^{-1}s^{-1}$ to about 44.8 $cm^2V^{-1}s^{-1}$.

The oxide semiconductor film can be obtained by a sputtering method using the sputtering target as described above.

Figure 2:
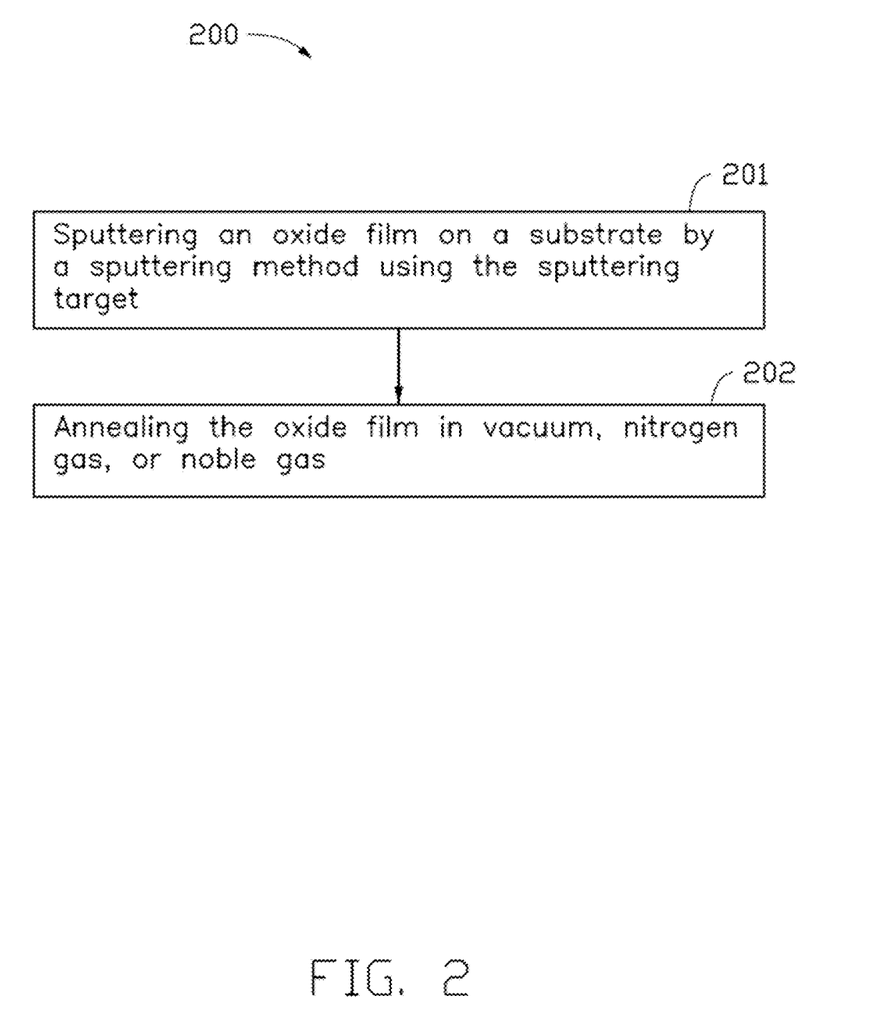
FIG. 2 is a flowchart of a method for making an oxide semiconductor film.

FIG. 2 reveals one embodiment of a method 200 for making the oxide semiconductor film, comprising a step of sputtering an oxide film on a substrate by the sputtering method using the sputtering target as described above, as shown in block 201.

The sputtering method can be a DC (direct current) sputter method, an AC (alternating current) sputter method, an RF (radio frequency) sputter method, a magnetron sputter method, or a medium frequency magnetron sputter method. The current of the sputtering can be about 0.1 A to about 2.0 A. The sputtering can take place for about 1 minute to about 120 minutes.

The sputtering can be at room temperature or a high temperature (e.g., smaller than or equal to 400° C.). When the high temperature is used in the sputtering, the method 200 further comprises a step of preheating the substrate. The substrate can be previously heated in vacuum at a temperature of about 50° C. to about 400° C.

A carrier gas is introduced into the sputtering chamber during the sputtering. The carrier gas can be a noble gas, a mixture of a noble gas and oxygen gas, or a mixture of a noble gas and hydrogen gas. In one embodiment, the noble gas can be Ar gas. For example, the carrier gas can be a mixture of Ar gas and oxygen gas. A flow rate of the oxygen gas can be less than 3 sccm. A purity of the carrier gas can be 3N to 5N.

The pressure in the sputtering chamber during the sputtering can be about 0.1 Pa to about 2.0 Pa.

The substrate can be an insulating substrate capable of enduring the sputtering temperature. Glass, silicon, or polymer (PET, PI, PE, etc.) can be used as the substrate. When the sputtering is at a relatively low temperature (e.g., at room temperature), the choice of the substrate material is wide.

Before the sputtering, the substrate can be previously cleaned to remove impurities on the surface of the substrate.

Before the sputtering, the sputtering target can be fixed on a support. An outer surface of the sputtering target can be parallel to the surface of the substrate. In another embodiment, an angle can be formed between the outer surface of the sputtering target and the surface of the substrate, the angle can be 20° to 85°. A distance between the outer surface of the sputtering target and the surface of the substrate can be smaller than or equal to 8 cm.

The oxide film formed on the surface of the substrate in block 201 can be directly used as the oxide semiconductor film. In another embodiment, the method can also comprise the annealing step shown in block 202.

In block 202, the oxide film can be annealed in a vacuum, or in an $N_2$ or noble gas (e.g., Ar gas) atmosphere. The background vacuum used in the annealing can be about $10^{-3}$ Pa to about 10 Pa. The annealing temperature can be in a range from about 100° C. to about 400° C. A speed of temperature increase can be in a range from about 1° C./min to about 20° C./min to increase the temperature of the oxide film to the annealing temperature. The oxide film can be annealed for about 1 hour to about 10 hours. The annealing step can slightly increase the crystallization of the oxide film to adjust the performance of the oxide semiconductor film.

The sputtering target is formed by doping an indium zinc oxide doped with Ce to obtain $In_2CeZn_xO_{5+x}$, wherein x=0.5~2. By using the sputtering target, the n-type oxide semiconductor film can be obtained, wherein the molar ratio of In, Ce, and Zn as In:Ce:Zn is 2:1:(0.5 to 2). The carrier density of the n-type oxide semiconductor film can be about $10^{12}$ cm$^{-3}$ to about $10^{20}$ cm$^{-3}$, and the carrier mobility of the n-type oxide semiconductor film can be about 5.0 cm$^2$V$^{-1}$s$^{-1}$ to about 45.0 cm$^2$V$^{-1}$s$^{-1}$. The n-type oxide semiconductor film can be used in an n-type TFT. The amount of Ce in the oxide semiconductor film cannot be too large or too small. When x<0.5, ICZO tends to be crystallized into another structure to decrease the electrical performance. When x>2, the relative content of In is relatively low, which greatly decreases the Hall mobility of the oxide semiconductor film.

One embodiment of a semiconducting device comprises the above described oxide semiconductor film.

Figure 3:
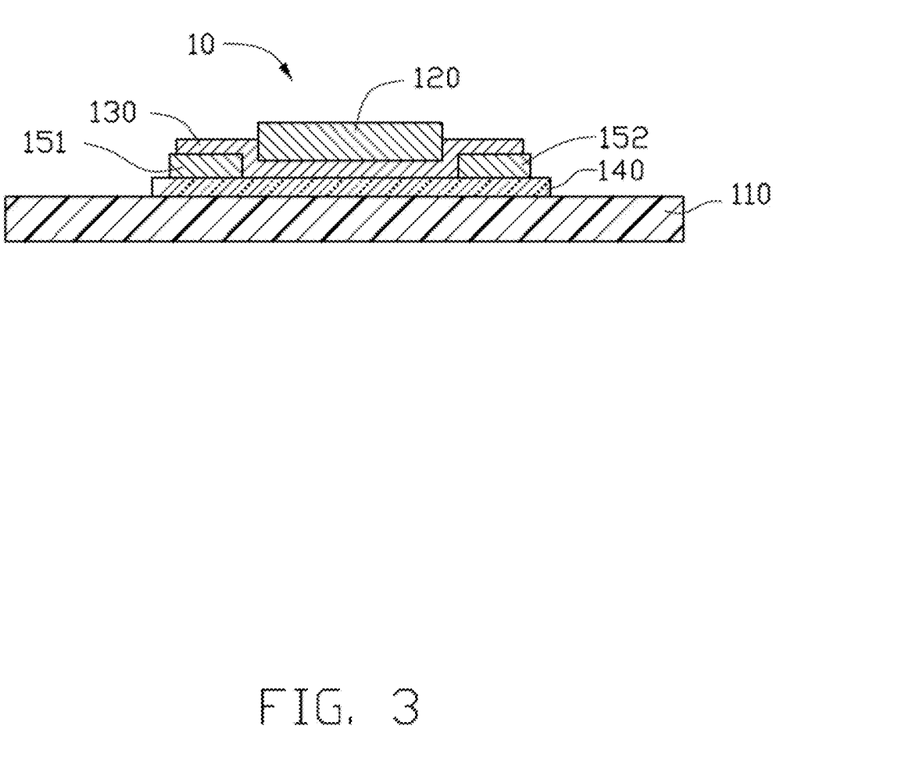
FIG. 3 is a schematic view of an embodiment of a TFT.

Referring to FIG. 3, one embodiment of a thin film transistor 10 comprises an insulating substrate 110, a semiconducting layer 140, a source electrode 151, a drain electrode 152, a gate electrode 120, and a insulating layer 130. The source electrode 151 and the drain electrode 152 are spaced from each other. The semiconducting layer 140 is electrically connected between the source electrode 151 and the drain electrode 152. The gate electrode 120 is insulated from the semiconducting layer 140, the source electrode 151, and the drain electrode 152 by the insulating layer 130. The semiconducting layer 140 can be the above described oxide semiconductor film. The thin film transistor 10 can be conventional except the semiconducting layer. The thin film transistor 10 can be a top gate structure as shown in FIG. 3, or a bottom gate structure.

Example 1: Sputtering Target

Example 1-1-1

$In_2O_3$ powder, $CeO_2$ powder and ZnO powder with a molar ratio as $In_2O_3:CeO_2:ZnO$ is 2:2:1 and purities of 4N are mixed in a ball milling machine having water as the liquid medium, at a rotating speed of about 200 rpm for about 10 hours. After that, the mixed substance is dried at a pressure of about 1 atm in an Ar gas atmosphere (5N) for about 1 hour to remove the water. The mixture is hot pressed in Ar gas atmosphere at a pressure of about 50 MPa and a temperature of about 1350° C. for about 5 hours with a speed of temperature increase of about 15° C./min. The obtained sputtering target has a relative density >87% and a bulk resistance of 0.75 Ωcm.

Example 1-2

$In_2O_3$ powder, $CeO_2$ powder and ZnO powder with a molar ratio as $In_2O_3:CeO_2:ZnO$ is 2:2:3 and purities of 4N are mixed in a ball milling machine having ethanol as the liquid medium at a rotating speed of about 400 rpm for about 20 hours. After that, the mixed substance is dried at a pressure of about 1 atm in an Ar gas atmosphere (5N) for about 1 hour to remove the ethanol. The mixture is placed in a mold and cold pressed at a pressure of about 75 MPa for about 60 minutes. The molded mixture is sintered at a normal pressure in $N_2$ gas atmosphere (5N) at a temperature of about 1450° C. for about 8 hours with a speed of temperature increase of about 10° C./min. The obtained sputtering target has a relative density >85% and a bulk resistance of 0.12 Ωcm.

Example 1-3

$In_2O_3$ powder, $CeO_2$ powder and ZnO powder with a molar ratio as $In_2O_3:CeO_2:ZnO$ is 2:2:1 and purities of 4N are mixed in a ball milling machine having water as the liquid medium at a rotating speed of about 500 rpm for about 10 hours. After that, the mixed substance is dried at a pressure of about 1 atm in an Ar gas atmosphere (5N) for about 1 hour to remove the water. The mixture is hot isostatically pressed in Ar gas atmosphere (5N) at a pressure of about 100 MPa and a temperature of about 1450° C. for about 20 hours with a speed of temperature increase of about 10° C./min. The obtained sputtering target has a relative density >86% and a bulk resistance of 0.62 Ωcm.

Example 2: Oxide Semiconductor Film

Example 2-1-1

Figure 4:
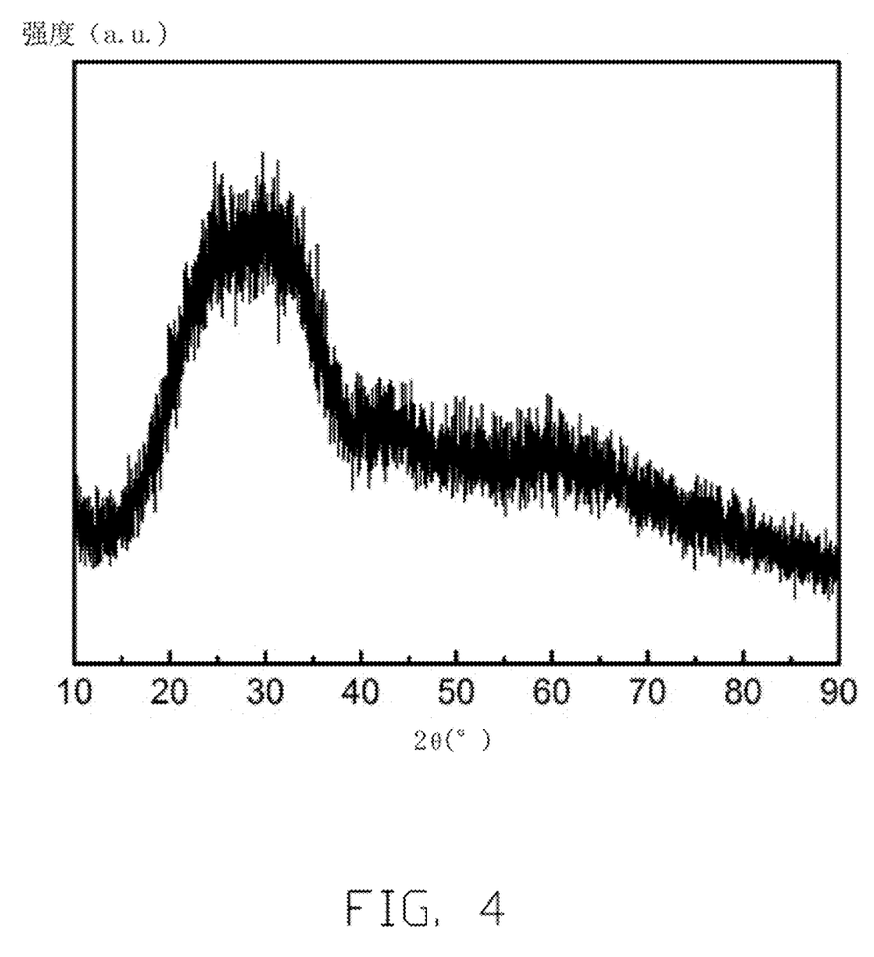
FIG. 4 shows an X-ray diffraction (XRD) pattern of the oxide semiconductor film in Example 2-1 post.
Figure 5:
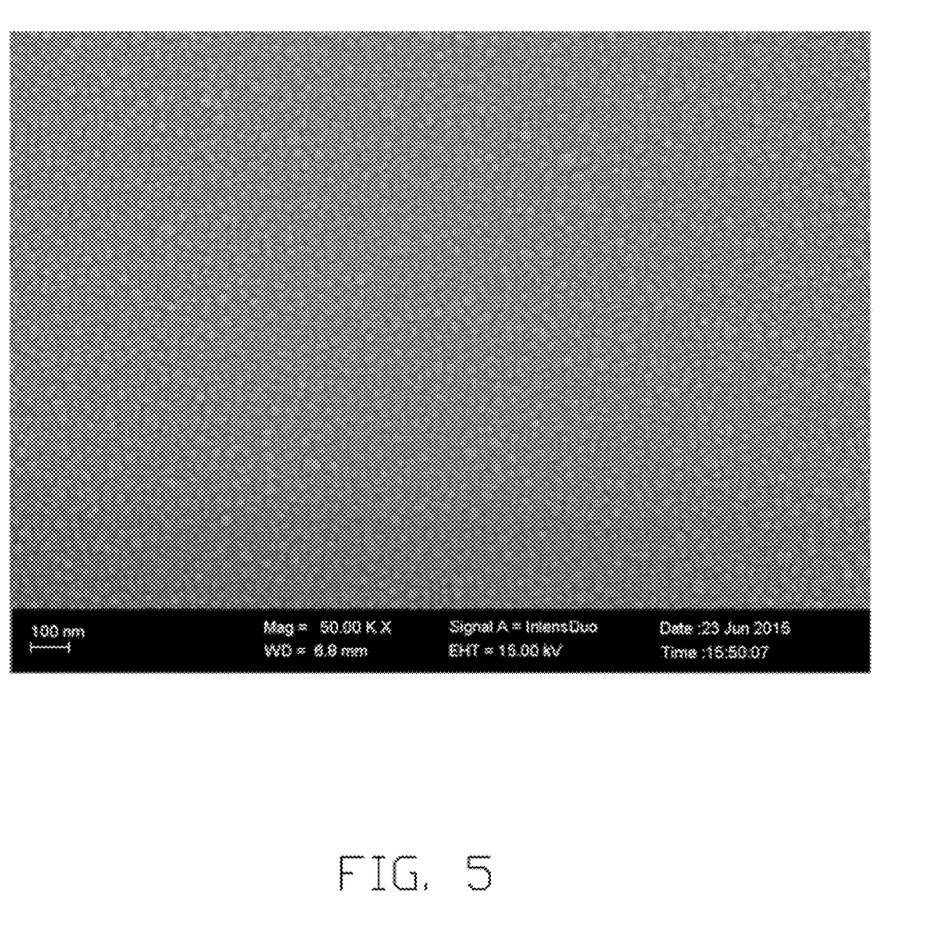
FIG. 5 shows a Scanning Electron Microscope (SEM) image of the oxide semiconductor film in Example 2-1.

A glass substrate is cleaned and dried by $N_2$ gas blowing. The glass substrate and the sputtering target of Example 1-1 are disposed in a sputtering chamber. The surfaces of the sputtering target and the substrate are parallel to each other about 8 cm distant. The carrier gas, which is Ar gas in this example, is introduced into the sputtering chamber. The Ar gas has a flow rate of about 40 sccm. The pressure in the sputtering chamber is about 0.7 Pa. The sputtering is at room temperature by using a current of about 1.0 A for about 28 minutes to form the oxide semiconductor film with a thickness of about 250 nm. The XRD pattern of the oxide semiconductor film is shown in FIG. 4 showing that the oxide semiconductor films are amorphous films. The surface morphology of the oxide semiconductor film is shown in FIG. 5.

Example 2-1-2

This example is the same as Example 2-1-1 except that the carrier gas is a combination of Ar gas and $O_2$ gas. The $O_2$ gas has a flow rate of about 0.5 sccm.

Example 2-1-3

This example is the same as Example 2-1-2 except that the O$_2$ gas has a flow rate of about 1 sccm.

Hall tests are conducted on the oxide semiconductor films of Examples 2-1, and reveal that the Hall mobility of the oxide semiconductor films are about 14.2 cm$^2$V$^{-1}$s$^{-1}$ to about 24.9 cm$^2$V$^{-1}$s$^{-1}$, and the carrier densities of the oxide semiconductor films are about 10$^{13}$ cm$^{-3}$ to about 10$^{20}$ cm$^{-3}$. The Hall mobility and carrier densities of the oxide semiconductor films of Examples 2-1 change with the O$_2$ gas flow rates are shown in Table 1.

Example 2-2-1

Figure 6:
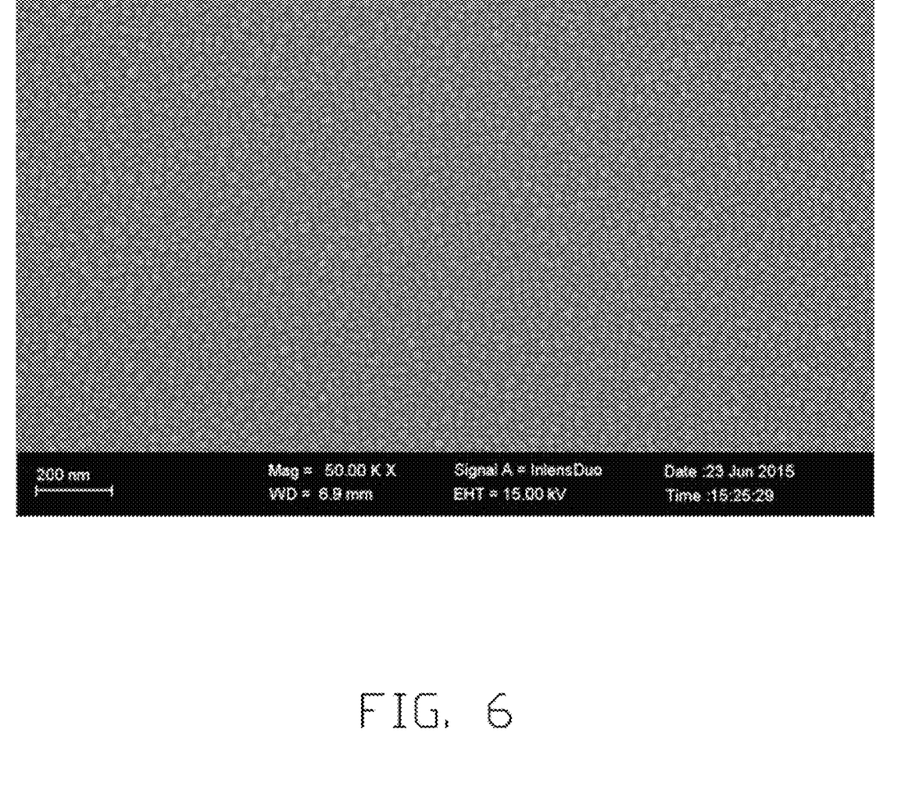
FIG. 6 shows an SEM image of the oxide semiconductor film in Example 2-2.
Figure 7:
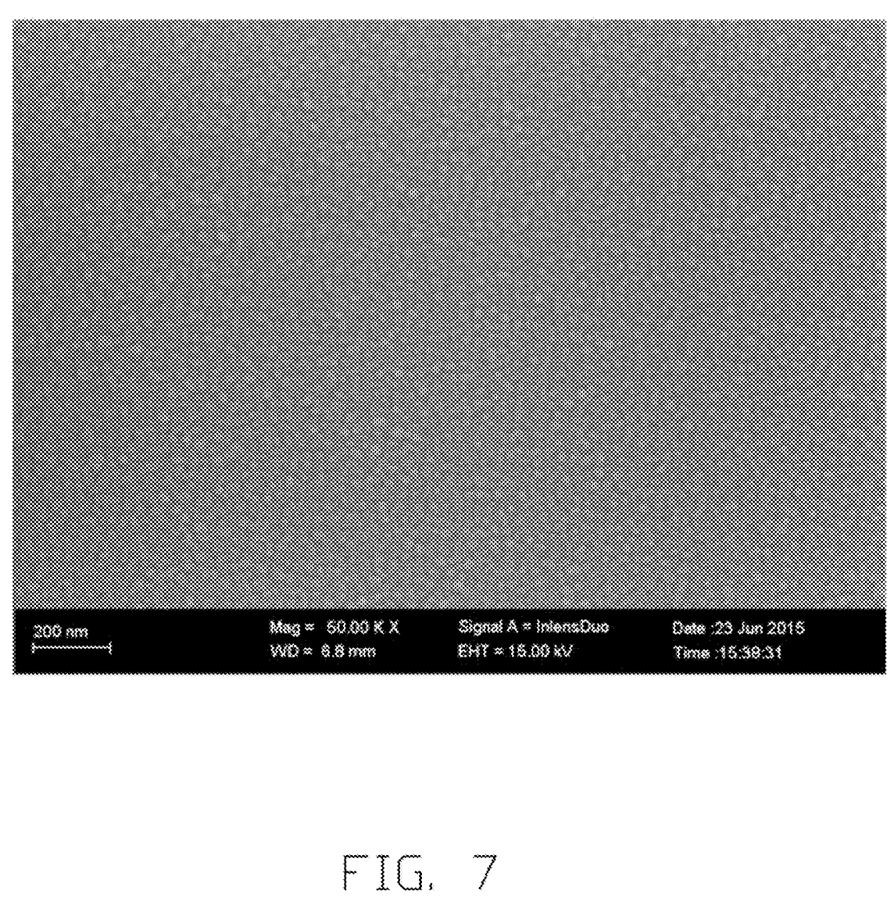
FIG. 7 shows an SEM image of the oxide semiconductor film in Example 2-3.

A glass substrate is cleaned and dried by N$_2$ gas blowing. The glass substrate and the sputtering target of Example 1-2 are disposed in a sputtering chamber. The surfaces of the sputtering target and the substrate are parallel to each other at about 8 cm distant. The substrate is preheated to about 250° C. The carrier gas, which is Ar gas in this example, is introduced into the sputtering chamber. The Ar gas has a flow rate of about 40 sccm. The pressure in the sputtering chamber is about 0.7 Pa. The sputtering is at 250° C. by using a current of about 1.0 A for about 28 minutes to form the oxide semiconductor film with a thickness of about 250 nm. The surface morphology of the oxide semiconductor film is shown in FIG. 6.

Example 2-2-2

This example is the same as Example 2-2-1 except that the carrier gas is a combination of Ar gas and O$_2$ gas. The O$_2$ gas has a flow rate of about 0.5 sccm.

Example 2-2-3

This example is the same as Example 2-2-2 except that the O$_2$ gas has a flow rate of about 1 sccm.

Hall tests are conducted on the oxide semiconductor films of Examples 2-2, and reveals that the Hall mobility of the oxide semiconductor films are about 17.3 cm$^2$V$^{-1}$s$^{-1}$ to about 44.8 cm$^2$V$^{-1}$s$^{-1}$, and the carrier densities of the oxide semiconductor films are about 10$^{15}$ cm$^{-3}$ to about 10$^{20}$ cm$^{-3}$. The Hall mobility and carrier densities of the oxide semiconductor films of Examples 2-2 change with the O$_2$ gas flow rates are shown in Table 1.

Example 2-3-1

A glass substrate is cleaned and dried by N$_2$ gas blowing. The glass substrate and the sputtering target of Example 1-3 are disposed in a sputtering chamber. The surfaces of the sputtering target and the substrate are parallel to each other at about 8 cm distant. The carrier gas, which is Ar gas in this example, is introduced into the sputtering chamber. The Ar gas has a flow rate of about 40 sccm. The pressure in the sputtering chamber is about 0.7 Pa. The sputtering is at room temperature by using a current of about 1.0 A for about 28 minutes to form the oxide semiconductor film with a thickness of about 250 nm. The oxide semiconductor film is then annealed an atmospheric pressure of 1 Pa for about 1 hour. The annealing temperature is about 150° C.

Example 2-3-2

This example is the same as Example 2-3-1 except that the annealing temperature is about 200° C.

Example 2-3-3

This example is the same as Example 2-3-1 except that the annealing temperature is about 300° C.

Hall tests are conducted on the oxide semiconductor films of Examples 2-3 before and after the annealing step. Before being annealed, the Hall mobility of the oxide semiconductor films reach about 15.6 cm$^2$V$^{-1}$s$^{-1}$, and the carrier densities of the oxide semiconductor films reach about 10$^{18}$ cm$^{-3}$. After being annealed, the Hall mobility of the oxide semiconductor films are about 16.7 cm$^2$V$^{-1}$s$^{-1}$ to about 20.3 cm$^2$V$^{-1}$s$^{-1}$, and the carrier densities of the oxide semiconductor films are about 10$^{14}$ cm$^{-3}$ to about 10$^{20}$ cm$^{-3}$. The Hall mobility and carrier densities of the oxide semiconductor films of Examples 2-3 change with the O$_2$ gas flow rates are shown in Table 1.

TABLE 1

| Example | In:Ce:Zn | O$_2$ gas flow rate (sccm) | annealing temperature (° C.) | Hall mobility (cm$^2$V$^{-1}$s$^{-1}$) | carrier density (cm$^{-3}$) |
| --- | --- | --- | --- | --- | --- |
| 2-1-1 | 4:2:1 | 0 | — | 23.5 | 5.8 × 10$^{18}$ |
| 2-1-2 | 4:2:1 | 0.5 | — | 24.9 | 1.1 × 10$^{20}$ |
| 2-1-3 | 4:2:1 | 1 | — | 14.2 | 3.7 × 10$^{14}$ |
| 2-2-1 | 4:2:3 | 0 | — | 44.8 | 7.3 × 10$^{20}$ |
| 2-2-2 | 4:2:3 | 1 | — | 30.1 | 2.5 × 10$^{18}$ |
| 2-2-3 | 4:2:3 | 2 | — | 17.3 | 6.4 × 10$^{15}$ |
| 2-3-1 | 4:2:1 | 0 | 150 | 20.3 | 1.3 × 10$^{20}$ |
| 2-3-2 | 4:2:1 | 0 | 200 | 19.7 | 2.1 × 10$^{19}$ |
| 2-3-3 | 4:2:1 | 0 | 300 | 16.7 | 7.8 × 10$^{14}$ |

Depending on the embodiment, certain of the steps of methods described may be removed, others may be added, and the sequence of steps may be altered. It is also to be understood that the description and the claims drawn to a method may comprise some indication in reference to certain steps. However, the indication used is only to be viewed for identification purposes and not as a suggestion as to an order for the steps.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An oxide semiconductor film comprising indium (In), cerium (Ce), zinc (Zn) and oxygen (O) elements, and a molar ratio of In, Ce, and Zn as In:Ce:Zn is in a range of 2:1:(0.5 to 2), a carrier density of about 10$^{12}$ cm$^{-3}$ to about 10$^{20}$ cm$^{-3}$, a carrier mobility of about 5.0 cm$^2$V$^{-1}$s$^{-1}$ to about 45.0 cm$^2$V$^{-1}$s$^{-1}$, and the oxide semiconductor film is an n-type semiconductor.

2. The oxide semiconductor film of claim 1 being an amorphous film.

3. The oxide semiconductor film of claim 1 having a band gap of about 3.0 eV to about 3.5 eV.

4. A sputtering target comprising an indium cerium zinc oxide represented by $In_2CeZn_xO_{5+x}$, wherein $x=0.5\sim2$.

5. The sputtering target of claim 4, wherein the $In_2CeZn_xO_{5+x}$ is a crystal.

6. A method for making a sputtering target comprising:
mixing indium oxide ($In_2O_3$) powder, cerium oxide ($CeO_2$) powder, and zinc oxide (ZnO) powder to form a mixture, a molar ratio of indium (In), cerium (Ce), and zinc (Zn) as In:Ce:Zn in the mixture is 2:1:(0.5 to 2); and
sintering the mixture at a temperature in a range from about 1250° C. to about 1650° C.

7. The method of claim 6, wherein the sintering comprises using a hot pressing method or a hot isostatic pressing method to simultaneously press and sinter the mixture, the hot pressing method comprises applying a pressure of about 30 MPa to 100 MPa at the temperature of about 1250° C. to about 1650° C. for about 1 hour to about 24 hours to the mixture, and the hot isostatic pressing method comprises applying a pressure of about 100 MPa to 300 MPa at the temperature of about 1250° C. to about 1650° C. for about 1 hour to about 40 hours to the mixture.

8. The method of claim 6 further comprising pressing the mixture into a desired shape before the sintering.

9. The method of claim 8, wherein the pressing comprising applying a pressure of about 30 MPa to about 300 MPa to the mixture.

10. The method of claim 6, wherein the sintering takes place in a protective gas.

* * * * *